United States Patent [19]

Lazarus et al.

[11] Patent Number: 4,996,122

[45] Date of Patent: Feb. 26, 1991

[54] METHOD OF FORMING RESIST PATTERN AND THERMALLY STABLE AND HIGHLY RESOLVED RESIST PATTERN

[75] Inventors: Richard M. Lazarus, Mission Viejo; Edward J. Reardon, Laguna Niguel, Calif.; Sunit S. Dixit, Mission Viejo, all of Calif.

[73] Assignee: Morton International, Inc., Chicago, Ill.

[21] Appl. No.: 496,240

[22] Filed: Mar. 20, 1990

Related U.S. Application Data

[60] Division of Ser. No. 376,971, Jul. 6, 1989, Pat. No. 4,943,511, which is a continuation of Ser. No. 229,088, Aug. 5, 1988, abandoned, which is a continuation-in-part of Ser. No. 175,706, Mar. 31, 1988, abandoned.

[51] Int. Cl.$^5$ ......................... G03F 7/023; G03F 7/30
[52] U.S. Cl. ....................................... 430/17; 430/18; 430/192; 430/193; 430/326
[58] Field of Search ................. 430/17, 18, 326, 302, 430/192, 193

[56] References Cited

U.S. PATENT DOCUMENTS

| | | | |
|---|---|---|---|
| 3,201,239 | 8/1965 | Neugebauer et al. | 430/193 |
| 4,059,449 | 11/1977 | Rosenkranz et al. | 430/192 |
| 4,377,631 | 3/1983 | Toukhy et al. | 430/192 |
| 4,439,516 | 3/1984 | Cernigliano et al. | 430/192 |
| 4,499,171 | 2/1985 | Hosaka et al. | 430/192 |
| 4,529,682 | 7/1985 | Toukhy | 430/192 |
| 4,731,319 | 3/1988 | Kohara et al. | 430/192 |

FOREIGN PATENT DOCUMENTS

| | | | |
|---|---|---|---|
| 211667 | 2/1987 | European Pat. Off. | 430/192 |
| 2172117 | 9/1986 | United Kingdom | 430/326 |
| 2190090 | 11/1987 | United Kingdom | 430/192 |

OTHER PUBLICATIONS

Hiraoka, H., *Materials for Microlithography*, ACS Symposium Series #226, pp. 340–359, 1984.

*Primary Examiner*—Charles L. Bowers, Jr.
*Attorney, Agent, or Firm*—Gerald K. White

[57] ABSTRACT

Positive photoresist compositions are provided which contain (a) a mixture of mono-, di-, and triesters of 2,3,4-trihydroxybenzophenone and 1,2-naphthoquinone-2-diazo-4-sulfonic acid and (b) a novolak resin selected from resins prepared from a phenolic component having a high p-cresol content or from a mixture of formaldehyde and an aromatic aldehyde.

17 Claims, No Drawings

METHOD OF FORMING RESIST PATTERN AND THERMALLY STABLE AND HIGHLY RESOLVED RESIST PATTERN

This is a divisional of copending application Ser. No. 07/376,971 filed on Jul. 6, 1989, U.S. Pat. No. 4,943,511, which is a File Wrapper Continuation of Ser. No. 07/229,088 filed Aug. 5, 1988 abandoned, which is a Continuation-In-Part of Ser. No. 07/175,706 filed Mar. 31, 1988, now abandoned.

CROSS REFERENCE TO OTHER APPLICATION

This application is related in subject matter to application Ser. No. 175,473 filed Mar. 31, 1988, now abandoned of R. M. Lazarus, R. Kautz, and S. S. Dixit entitled "MIXED ALDEHYDE NOVOLAK RESINS AND HIGH CONTRAST HIGH THERMAL STABILITY POSITIVE PHOTORESISTS PREPARED THEREFROM", which application was filed concurrently with this application.

BACKGROUND OF THE INVENTION

(1) Field of the Invention

The present invention relates generally to positive photoresists containing cresol-aldehyde novolak resins having a high p-cresol content and a photoactive component comprising mono-, di-, and triesters of 2,3,4-trihydroxybenzophenone and 1,2-naphthoquinone-2-diazo-4-sulfonyl chloride.

(2) Description of the Prior Art

It is well known in the art to produce positive photoresist formulations such as those described in U.S. Pat. Nos. 3,666,473; 4,115,128; and 4,173,470. These include alkali-soluble phenol- (or cresol-) formaldehyde novolak resins together with light-sensitive materials (sometimes called "photoactive components"), usually substituted naphthoquinonediazide compounds. The resins and sensitizers are dissolved in an organic solvent or mixture of solvents and are applied as a thin film or coating to a substrate suitable for the particular application desired.

The novolak resin component of these positive photoresist formulations is soluble in aqueous, alkaline solutions, but the naphthoquinone sensitizer acts as a dissolution rate inhibitor with respect to the resist. Upon exposure of selected areas of the coated substrate to actinic radiation, however, the sensitizer undergoes a radiation induced structural transformation, and the exposed areas of the photoresist coating are rendered more soluble than the unexposed areas. This difference in solubility rates causes the exposed areas of the positive photoresist coating to be dissolved when the substrate is immersed in alkaline developing solution while the unexposed areas are largely unaffected, thus producing a positive relief pattern on the substrate.

In most instances, the exposed and developed substrate will be subjected to treatment by a substrate etchant solution or by dry etching. The positive photoresist coating protects the coated areas of the substrate from the etchant and thus the etchant is only able to etch the uncoated areas of the substrate, which in the case of a positive photoresist, correspond to the areas that were exposed to actinic radiation. Thus, an etched pattern can be created on the substrate which corresponds to the pattern of the mask, stencil, template, or the like that was used to create selective exposure patterns on the coated substrate prior to development.

The relief pattern of photoresist on substrate produced by the method described above is useful for various applications including, for example, as an exposure mask or pattern such as is employed in the manufacture of miniaturized integrated electronic components.

The properties of a photoresist composition which are important in commercial practice include the photospeed of the resist, development contrast, resist resolution, and resist adhesion. Also, since the photoresist may have to withstand an ion implantation process which may be conducted at high temperature, the thermal stability of the photoresist may be important.

Increased photospeed is important for a photoresist, particularly in applications where a number of exposures are needed, for example, in generating multiple patterns by a repeated process, or where light of reduced intensity is employed such as in projection exposure techniques where the light is paned through a series of lenses and monochromatic filters. Thus, increased photospeed is particularly important for a resist composition employed in processes where a number of multiple exposures must be made to produce a mask or series of circuit patterns on a substrate. These optimum conditions include a constant development temperature and time in a particular development mode, and a developer system selected to provide complete development of exposed resist areas while minimizing the film thickness loss in the unexposed areas.

Development contrast refers to a comparison between the percentage of film loss in the exposed area of development with the percentage of film loss on the unexposed area. Ordinarily, development of an exposed resist coated substrate is continued until the coating on the exposed area is substantially completely dissolved away and, thus, development contrast can be determined simply by measuring the percentage of the film coating loss in the unexposed areas when the exposed coating areas are removed entirely.

Resist resolution refers to the capability of a resist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a photoresist is required to provide a high degree of resolution for very small line and space widths (on the order of one micron or less).

The ability of a resist to reproduce very small dimensions, on the order of one micron or less, is extremely important in the reproduction of large scale integrated circuits on silicon chips and similar components. Circuit density on such a chip can only be increased, assuming photolithographic techniques are used, by increasing the resolution capabilities of the resist.

One approach to increasing the resolution capabilities of a resist is to expose with shorter wavelength light. For example, exposures with mid-UV radiation (about 280–365 nm) typically give on the order of 0.25 $\mu$m better resolution than exposures in the near UV region (about 365–459 nm).

One attempt at increasing resolution is provided in U.S. Pat. No. 4,596,763 to DiCarlo et al. (issued June 24, 1986) where a positive photoresist containing a novolak resin and a 1-naphthalene sulfonic acid, 3-diazo-3,4-dihydro-4-oxo-4-benzoyl-1,2,3-benzenetriyl ester photosensitizer is said to provide increased photospeed while retaining or improving the resist contrast in the mid-UV region.

U.S. Pat. No. 4,499,171 to Hosaka et al. (issued Feb. 12, 1985) also discloses positive photoresists which are said to possess excellent sensitivity and yield of residual film thickness. These photoresists contain a novolak resin and a photoactive component which may be a mixture of tri- and diesters of 1,2-naphthoquinonediazide-4-sulfonic acid and 2,3,4-trihydroxybenzophenone. The photoactive component may also contain 2,3,4-trihydroxybenzophenone-1,2-naphthoquinonediazide-4-sulfonic acid monoester.

U.S. Pats. No. 4,377,631 to Toukhy et al. (issued Mar. 22, 1983) and 4,529,682 to Toukhy (issued July 16, 1985) disclose cresol-formaldehyde novolak resins made from mixtures containing meta- and para-cresol, or ortho-, meta-, and para-cresol. These novolak resins may be used with conventional photosensitizers to prepare fast positive photoresist compositions, i.e., those with fast photospeed and good resolution and development contrast. These compositions are particularly sensitive to radiation in the near-ultraviolet to conventional ultraviolet range, i.e., radiation from a wavelength of about 315 to about 450 nanometers. The ratio of ortho-, meta-, and para-cresol in the novolak resins is said to be specific. For instance, when the novolak contains only meta- and para-cresol, a maximum of 53% para-cresol may be used (resins containing 55% para-cresol are specifically stated to be outside the scope of the invention in Table I of U.S. Pat. No. 4,529,682).

Positive photoresists said to have improved photospeed and rate of development are also disclosed in U.S. Pat. No. 4,650,745 to Eilbeck (issued Mar. 17, 1987). The resist contains a novolak resin prepared from, e.g., a 45% meta-cresol, 55% para-cresol mixture, a naphthoquinonediazide sensitizer (e.g., esters of 2,3,4-trihydroxybenzophenone and naphthaquinone-(1,2)-diazide-5-sulfonyl chloride), a dye which absorbs light at a maximum wavelength of from about 330 to about 460 nanometers, and a trihydroxybenzophenone compound.

U.S. Pat. No. 4,731,319 to Kohara et al. (issued Mar. 15, 1988) discloses positive photoresist compositions containing a naphthoquinone diazide sulfonic acid ester photosensitizer and a mixture of cresol novolak resins containing (1) a first cresol novolak resin having a weight-average molecular weight of at least 5000 and produced from an isomeric mixture consisting essentially of 60 to 80% of m-cresol and 40 to 20% of p-cresol, and (2) a second cresol novolak resin having a weight-average molecular weight not exceeding 5000 and produced from an isomeric mixture consisting essentially of 10 to 40% of m-cresol and 90 to 60% of p-cresol. The proportions of the two cresol novolak resins are chosen so that the overall cresol component is comprised of from 30 to 46.5% m-cresol and 70 to 53.5% p-cresol. The only photosensitizers disclosed are 2,3,4-trihydroxybenzophenone naphthaquinone-1,2-diazido-5-sulfonic acid ester; 2,3,4,4'-tetrahydroxybenzophenone naphthoquinone-1,2-diazido-5-sulfonic acid ester; propyl gallate naphthoquinone-1,2-diazido-5-sulfonic acid and isoamyl gallate naphthoquinone-1,2-diazido-5-sulfonic acid.

European Patent Application Publication No. 0211667 of Hosaka et al. (published Feb. 25, 1987) discloses that monooxymonocarboxylic acid esters, e.g., alkyl 3-alkoxypropionates, are solvents for positive photoresist compositions which impart high storage stability to the resist, i.e., only a small amount of fine particles are formed during storage. The resist may contain novolak resins made from o-, m-, or p-cresol or mixtures thereof (e.g., a mixture of 60% m-cresol and 40% p-cresol) and 1,2-naphthoquinonediazide ester photosensitizers. These sensitizers include 2,3,4-trihydroxybenzophenone-1,2-naphthoquinonediazide-4-sulfonic acid ester, though the 5-sulfonic acid ester isomers are preferred.

European Patent Application Publication No. 0225464 of Collini et al. (published June 16, 1987) discloses composite, two-layer resist structures. The bottom layer is a positive photoresist containing a novolak resin and a diazoquinone compound, e.g., 4',2',3'-dihydroxybenzophenone mixed esters of 1-oxo-2-diazonaphthalene-5-sulfonic acid [sic]. These photoresists are said to be particularly suitable in the mid ultraviolet range (300–350 nanometers) and the near ultraviolet rane (365 to 450 nanometers).

E. Gipstein et al., "Evaluation of Pure Novolak Cresol-Formaldehyde Resins for Deep U.V. Lithography," *J. Eleotrochem. Soc.: Solid-State Science and Technology*, Vol. 129, No. 1, pp. 201–205 discusses the effects of novolak resins made from pure o-, m-, or p-cresol on positive photoresists which are exposed to radiation at 254 nm (in the so-called "deep U.V." region). The conventional novolak resins are said to be essentially transparent at 405 nm (i.e., the wavelength of mercury emissions), but have a strong absorption at 254 nm. Thus, the combined absorption of the photoactive component and resin in the resist renders films more than 1 μm thick virtually opaque at 254 nm. Gipstein et al. disclose that novolak resins made from pure o-, m- , or p-cresol are more transparent at 254 nm than the conventional resins, the pure p-cresol novolak being the most transparent.

In a reprint from the Proceedings of SPIE—The International Society for Optical Engineering (Vol. 771, March 1987) entitled "DYNALITH ® Resists for Mid-UV Applications: Formulation Optimization for GaAs Related Processing", R. M. Lazarus and S. S. Dixit discuss the properties of DYNATITH ®X-1605 and X-1608 positive photoresists. DYNATITH ® X-1608 is said to employ a novolak of greater para incorporation than is typical and a sensitizer derived from the following diazo compound:

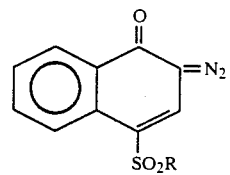

2,1,4 O-Diazo Ketone

The X-1608 resist has high photospeed and high resolution properties.

Thus, there has long been a need for positive resist compositions which exhibit high photospeeds and good resolution properties when exposed to radiation of relatively short wavelength, e.g., about 248–365 nm. It has now been discovered that positive photoresists comprising novolak resins having a high p-cresol content and a photosensitizer comprising a mixture of mono-, di-, and triesters of 2,3,4-trihydroxybenzophenone and 1,2-naphthoquinone-2-diazo-4-sulfonyl halide provide excellent photospeed and resolution when exposed to radiation in the 248–365 nm range.

SUMMARY OF THE INVENTION

In accordance with the present invention, there are provided positive photosensitive compositions (also called positive photoresists) comprising an admixture of a 1,2-naphthoquinonediazide photosensitizer and a bindingly effective amount of a novolak resin wherein:

A. said photosensitizer comprises an admixture of
2,3,4-trihydroxybenzophenone-1,2-naphthoquinone-2-diazo-4-sulfonic acid triester;
2,3,4-trihydroxybenzophenone-1,2-naphthoquinone-2-diazo-4-sulfonic acid diester and
2,3,4-trihydroxybenzophenone-1,2-naphthoquinone-2-diazo-4-sulfonic acid monoester in the following relative amounts:

triester: 50 weight percent (based on the total weight of triester, diester, and monoester) to about 75 weight percent monoester and diester: balance, in a monoester/diester weight ratio of about ½, said wt % being based on the total weight of the mono-, di- and triester; and B. said novolak resin comprises a resin selected from the group consisting of:

1. a resin prepared by condensing an aliphatic aldehyde, aromatic aldehyde or mixture thereof with a phenolic component comprising a mixture of p-cresol and m-cresol containing at least about 60 weight percent p-cresol, based on the total weight of p-cresol and m-cresol, and a sufficient amount of m-cresol to render said novolak resin soluble in an aqueous, alkaline solution, said phenolic component being essentially free of o-cresol; and 2. a novolak resin which is the condensation product of (a) a phenol, phenol derivative or mixture thereof and (b) a mixture of formaldehyde or a formaldehyde precursor and an aromatic aldehyde.

Also provided in accordance with the present invention are positive photosensitive compositions containing components A and B described above and a solvent, wherein said solvent is selected from the group consisting of (1) a mixture of ethyl Cellosolve acetate, butyl acetate, and xylene; (2) a mixture of propylene glycol monomethyl ether acetate, butyl acetate, and xylene; (3) ethyl-3-ethoxy propionate; (4) propylene glycol monomethyl ether acetate; and (5) a mixture of propylene glycol monomethyl ether acetate, butyl acetate, and ethyl-3-ethoxy propionate.

Further provided in accordance with the present invention is a method of forming a resist pattern on a substrate, said process comprising:

A. coating said substrate with a layer of a positive photoresist composition;

B. exposing said layer patternwise to actinic radiation; and

C. removing the exposed portion of said layer with an aqueous alkaline developer for the exposed resist composition to uncover the areas of the substrate beneath the exposed portions; said positive photoresist comprising, prior to exposure, an admixture of a 1,2-naphthoquinonediazide photosensitizer and a bindingly effective amount of a novolak resin wherein:

I. said photosensitizer comprises an admixture of
2,3,4-trihydroxybenzophenone-1,2-naphthoquinone-2-diazo-4-sulfonic acid triester;
2,3,4-trihydroxybenzophenone-1,2-naphthoquinone-2-diazo-4-sulfonic acid diester; and
2,3,4-trihydroxybenzophenone-1,2-naphthoquinone-2-diazo-4-sulfonic acid monoester in the following relative amounts:

triester—about 50 wt % to about 75 wt %, monoester and diester—balance, in a mono-ester/diester weight ratio of about ½, said wt % being based on the total weight of the mono-, di-, and triester; and II. said novolak resin comprises a resin selected from the group consisting of:

a. a resin prepared by condensing an aliphatic aldehyde, aromatic aldehyde or mixture thereof with a phenolic component comprising a mixture of p-cresol and m-cresol containing at least about 60 weight percent p-cresol, based on the total weight of p-cresol and m-cresol, and a sufficient amount of m-cresol to render said novolak resin soluble in an aqueous, alkaline solution, said phenolic component being essentially free of o-cresol; and b. a novolak resin which is the condensation product of (a) a phenol, phenol derivative, or mixture thereof and (b) a mixture of formaldehyde or a formaldehyde precursor and an aromatic aldehyde.

Also in accordance with the present invention there is provided a substrate coated with a thermally stable and highly resolved, exposed resist pattern, said resist pattern being formed from a positive photoresist composition which, prior to exposure to actinic radiation, comprises A. a photosensitizer comprising an admixture of
2,3,4-trihydroxybenzophenone-1,2-naphthoquinone-2-diazo-4-sulfonic acid triester;
2,3-4-trihydroxybenzophenone-1,2-naphthoquinone-2-diazo-4-sulfonic acid diester, and
2,3,4-trihydroxybenzophenone-1,2-naphthoquinone-2-diazo-4-sulfonic acid monoester in the following relative amounts:

triester—about 50 wt % to about 75 wt % monoester and diester—balance, in a monoester/diester weight ratio of about ½, said wt % being based on the total weight of the mono-, di- , and triester; and B. a novolak resin comprising a resin selected from the group consisting of:

1. a resin prepared by condensing an aliphatic aldehyde, aromatic aldehyde or mixture thereof with a phenolic component comprising a mixture of p-cresol and m-cresol containing at least about 60 weight percent p-cresol, based on the total weight of p-cresol and m-cresol, and a sufficient amount of m-cresol to render said novolak resin soluble in an aqueous, alkaline solution, said phenolic component being essentially free of o-cresol; and 2. a novolak resin which is the condensation product of (a) a phenol, phenol derivative or mixture thereof and (b) a mixture of formaldehyde or a formaldehyde precursor and an aromatic aldehyde.

DETAILED DESCRIPTION OF THE PREFERRED EMBODIMENTS

The positive photoresists of the present invention comprise a photosensitizer (also known as a "photoactive component" or "PAC") and a novolak resin binder. The photosensitizer is a mixture of mono-, di-, and triesters of 2,3,4-trihydroxybenzophenone and 1,2-naphthoquinone-2-diazo-4-sulfonyl chloride. The reactants which form the mono-, di-, and triesters have the following structures:

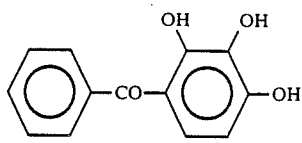

2,3,4-trihydroxybenzophenone

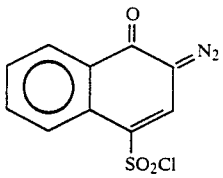

1,2-naphthoquinone-2-diazo-4-sulfonyl chloride and the resulting mono-, di-, and triesters have the following structures:

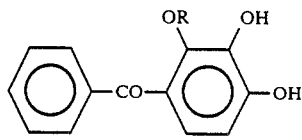

2,3,4-trihydroxybenzophenone-1,2-naphthoquinone-2-diazo-4-sulfonic acid monoester

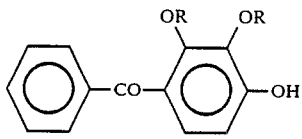

2,3,4-trihydroxybenzophenone-1,2-naphthoquinone-2-diazo-4-sulfonic acid diester

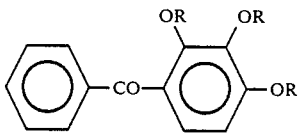

2,3,4-trihydroxybenzophenone-1,2-naphthoquinone-2-diazo-4-sulfonic acid triester where R is

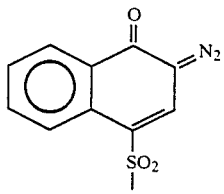

The above mono-, di-, and triesters are known in the art and may be prepared by known methods, such as the general procedure described in U.S. Pat. 4,499,171 to Hosaka et al., issued Feb. 12, 1985, which is hereby incorporated by reference herein.

The novolak resins useful in the practice of the present invention fall into two categories. The first, termed herein the "high p-cresol novolak resins" are prepared by condensing an aliphatic aldehyde, aromatic aldehyde, or mixtures thereof with a phenolic component which is a mixture of p-cresol and m-cresol which is essentially free of o-cresol. While it is preferable that the phenolic component contain no o-cresol whatsoever, o-cresol is commonly present as an impurity in p-and/or m-cresol. Thus, as used herein, the phrase "essentially free of o-cresol" means less than about 5% by weight of the phenolic component is o-cresol.

It is desirable to maximize the p-cresol content of the phenolic component in the high p-cresol resin in order to provide maximum transparency of the positive resist in the 248–365 nm range. However, novolak resins prepared from a phenolic component which is 100% p-cresol are difficult to dissolve in the aqueous, alkaline solutions, e.g., aqueous solutions of tetramethylammonium hydroxide, typically used as developers for positive resists. Thus, the phenolic component of the novolak resins useful in the present invention contain sufficient m-cresol to allow the resin to dissolve in an aqueous, alkaline (typically at a pH of about 12 or higher) solution. Typically, an unexposed positive photoresist containing said resin is dissolved by immersing the unexposed resist in an aqueous solution containing about 1.5% to about 2.4% tetramethylammonium hydroxide (TMAH) at about 19° C. for about 60 seconds. Alternatively, the TMAH solution can be applied to the unexposed resist by the so-called "spray puddle" process for about 20–42 seconds. In general, this dissolution is achieved by using a phenolic component which has a weight ratio of p-cresol: m-cresol of from about 60:40 to about 80:20.

The aldehyde which may be used to prepare the high p-cresol novolak resin are aliphatic aldehydes, such as formaldehyde, aromatic aldehydes such as 4-hydroxybenzaldehyde, and mixtures of aliphatic and aromatic aldehydes, such as formaldehyde and 4-hydroxybenzaldehyde.

In preparing the high p-cresol novolak resins of the present invention, the ratio of aldehyde component to phenolic component should be as follows:

$$\frac{\text{moles total aldehyde component}}{\text{moles total phenol component}} \times 100 = \text{about } 60\% \text{ to about } 95\%$$

The second type of novolak resin useful in the present invention is prepared using a mixture of formaldehyde or a formaldehyde precursor and a monohydroxy aromatic aldehyde. These resins are termed herein the "mixed aldehyde novolak resins" and are the subject of a co-pending application Ser. No. 175,473 filed Mar. 31, 1988, now abandoned of R. M. Lazarus, R. Kautz, and S. S. Dixit, which application is hereby incorporated by reference herein.

The mixed aldehyde novolak resins useful in the present invention are prepared from (1) phenol or a phenol derivative, and (2) a mixture of aldehydes which contains formaldehyde (or a formaldehyde precursor) and an aromatic aldehyde. The phenol and phenol derivatives useful in preparing these mixed aldehyde novolak resins include, but are not limited to, phenol, m-cresol, p-cresol, o-cresol, and mixtures thereof. Other examples of phenol derivatives may be found in H. Hiraoka, "Functionally Substituted Novolak Resins: Lithographic Applications, Radiation Chemistry, and Photooxidation", *Materials For Microlithography*, ACS Symposium Series No. 266 (1984) which is hereby incorporated by reference herein. They may also contain other substituents on the aromatic ring including, for example, alkyl or halogen moieties.

The mixed aldehydes useful in preparing the mixed aldehyde novolak resins useful in the present invention contain formaldehyde or a formaldehyde precursor. As used herein, "formaldehyde precursor" refers to compounds, such as 1,3,5-S-trioxane and paraformaldehyde which, under the reaction conditions employed to prepare the novolak resin will produce formaldehyde. As used herein, the term "formaldehyde" is understood to include both formaldehyde per se and formaldehyde precursors. The second component of the aldehyde mixture is any aromatic aldehyde which will form a novolak resin with phenol or a phenol derivative. In general, these aromatic aldehydes include, but are not limited to, compounds having the general formula:

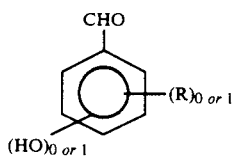

where R is halogen (e.g. chlorine), alkyl (e.g. $C_1-C_4$ alkyl). Examples of preferred aromatic aldehydes include benzaldehyde, 2-chlorobenzaldehyde, and monohydroxy aromatic aldehydes such as 2-hydroxybenzaldehyde, 3-hydroxybenzaldehyde, and 4-hydroxybenzaldehyde. Mixtures of aromatic aldehydes may also be used. The monohydroxy benzaldehydes are particularly preferred since they produce novolak resin which may be used to make high resolution, high thermal stability positive photoresists.

The relative amounts of the phenol or phenol derivative and mixed aldehydes used to prepare the mixed aldehyde novolak resins used in the present invention may vary considerably. In general, these relative amounts are chosen to produce novolak resins having high melting points (Tg), high degree of substitution at the bridging carbons and relatively low molecular weights (compared to novolak resins prepared from formaldehyde only). Typically, the following amounts of reactants are employed to produce the mixed aldehyde novolak resins of this invention.

$$\frac{\text{Moles total aldehyde}}{\text{Moles total phenol or phenol derivative}} \times 100 = \text{about } 60\% \text{ to about } 95\%$$

$$\frac{\text{Moles aromatic aldehyde}}{\text{Moles total aldehyde}} \times 100 = \text{about } 15\% \text{ to about } 95\%$$

In a preferred embodiment, the phenol component is a mixture of phenol derivatives; namely, a mixture of m-cresol and p-cresol. When such a mixture is employed, it typically contains the following relative amounts of m- and p-cresol;

$$\frac{\text{Moles } m\text{-cresol}}{\text{Moles total cresol}} * \times 100 = \text{about } 30\% \text{ to about } 75\%$$

*It is not uncommon for commercially available cresols to contain minor amounts of o-cresol. Therefore, "Moles total cresol" refers to moles of m-, p-, and o-cresol (if any) and not just m- and p-cresol. It is preferred, however, that the o-cresol content be less than about 1% of the total cresol.

Given the above reactants and their relative amounts, one of ordinary skill in the art would be capable of preparing the high p-cresol and mixed aldehyde novolak resins of the present invention without undue experimentation. Basically, all of the ingredients are placed in a suitable reaction vessel and a nonreactive solvent added. An acid catalyst, such as p-toluenesulfonic acid, is added in a mole ratio of moles catalyst/moles total cresol of about 0.01 to about 0.04. The reaction mixture is then raised to reflux temperature and reflux maintained until no more by-product water is produced, indicating that the reaction is complete.

The positive photoresists of the present invention exhibit high sensitivity to actinic wavelengths between about 248 and about 365 nm while at the same time achieving excellent resolution. It is believed there are three critical elements in the positive resists of this invention which combine to achieve this high sensitivity and resolution. Those elements are (1) the relatively high p-cresol content in the high p-cresol novolak resins, when they are used, (2) the chemical structure of the photosensitizer and (3) the relative amounts of the mono-, di-, and triester in the photosensitizer. Thus, for example, positive resists using photosensitizers which are the esters of 2,3,4-trihydroxybenzophenone and 1,2-naphthoquinone-2-diazo-5-sulfonyl chloride are not nearly as sensitive to actinic radiation in the 248-365 nm range as are the resists of the present invention which employ the esters of 2,3,4-trihydroxybenzophenone and 1,2-naphthoquinone-2-diazo 4-sulfonyl chloride. Likewise, positive resists formulated with the mono-, di-, and triesters of 2,3,4-trihydroxybenzophenone and 1,2-naphthoquinone-2-diazo-4-sulfonyl chloride, but with relative amounts of the mono-, di-, and triester substantially outside the range of the present invention do not perform as well as those of the present invention, those having a higher triester content not being as sensitive in the 248-365 nm range as are the resists of the present invention, and those with a lower triester content having too high a photospeed, poor thermal stability, and high film loss.

The fact that the positive photoresists of the present invention exhibit high sensitivity to actinic wavelengths between about 248 nm and about 365 nm means that these resists are especially advantageous when used in processes in which the actinic radiation is produced by a laser, e.g., radiation in the 248 nm range.

The critical components of the positive photoresist formulation; namely, the novolak resins of the present invention and the photosensitizer component, can be employed over a wide range of relative amounts. In general, it is necessary only that sufficient photosensitizer be employed to produce a resist which is photoimagable and that the amount of novolak resin be bindingly effective. In terms of relative amounts, the positive photoresists of this invention may contain from about 2 parts by weight (pbw) novolak resin per pbw photosensitizer component to about 6 pbw novolak resin per pbw photosensitizer component. Preferably, a ratio of about 4 pbw novolak resin per pbw photoactive component is employed.

The positive photoresists of the present invention contain, in addition to the novolak resin and photosensitizer, a solvent. Examples of solvents which may be employed include, but are not limited to, propylene glycol monomethyl ether acetate (PMA), ethyl Cellosolve acetate (ECA), ethyl-3-ethoxy propionate (EEP), mixtures of ECA, butyl acetate and xylene, mixtures of PMA, butyl acetate and xylene, and mixtures of PMA, butylacetate, and EEP. PMA and EEP are preferred over ECA since they exhibit lower toxicity. EEP is particularly preferred in that it provides a more stable environment for the components, and provides better particulate stability, i.e., the tendency to form particles in the resist upon storage is reduced. The use of EEP alone also produces striation-free coatings which have a more reproducible photospeed than, for example, the solvents which are three component mixtures.

The amount of solvent in the resist may vary considerably. Generally, all that is required is that sufficient solvent be employed to produce a desired coating thickness under the given coating conditions, e.g., spin speed and pre-bake temperature. Typically, however, enough solvent is added to the positive photoresist formulation to produce a photoresist having about 25–30% solids.

When mixtures of solvents are employed, they are typically used in the following relative amounts:

| Solvent | Approx. Amount (wt) |
|---|---|
| ECA | 80% |
| Butyl acetate | 10% |
| Xylene | 10% |
| PMA | 80% |
| Butyl acetate | 10% |
| Xylene | 10% |
| PMA | 65% |
| Butyl acetate | 30% |
| EEP | 5% |

The positive resists of this invention may also contain various additives such as colorants, striation aids, and the like. Also, the novolak resin component of the resist may be comprised entirely of the high p-cresol or mixed aldehyde resin or may contain up to about 35 weight percent (based on the total weight of the resin component of the resist) of a conventional novolak resin, such as a cresol/formaldehyde novolak resin prepared using a mixture of 65–70% m-cresol and 30–35% p-cresol.

In fact, when the high p-cresol resins are employed in the photoresist formulation, it is preferred that the novolak resin component of the resist contain about 65 weight percent high p-cresol novolak resin and about 35 weight percent conventional novolak resin in order to minimize film loss and maximize thermal stability.

The following examples illustrate the present invention and its advantages.

EXAMPLE 1

This example illustrates a typical procedure for making the novolak resins of the present invention.

The following reagents were used in the amounts indicated below to prepare a high p-cresol novolak resin:

| Reagent | Amount |
|---|---|
| m-cresol | 325 g. |
| p-cresol | 603 g. |
| formaldehyde (37%) | 443 g. |
| oxalic acid | 71 g. |

All reagents were combined and heated at reflux. After an appropriate heating period, water was stripped off and the resulting resin was dissolved in methanol. The resin was then purified by precipitation with water.

EXAMPLES 2–19

Other high p-cresol novolak resins prepared in a manner similar to that of Example 1 using the reagents indicated in Table I below:

TABLE I

| Ex. No. | Form.[1] | p-cresol[2] | m-cresol[3] |
|---|---|---|---|
| 2 | 77 | 70 | 30 |
| 3 | 77 | 80 | 20 |
| 4 | 66 | 65 | 35 |
| 5 | 66 | 70 | 30 |
| 6 | 66 | 75 | 25 |
| 7 | 64 | 60 | 40 |
| 8 | 64 | 65 | 35 |
| 9 | 64 | 65 | 35 |
| 10 | 64 | 70 | 30 |
| 11 | 64 | 75 | 25 |
| 12 | 62 | 65 | 35 |
| 13 | 62 | 70 | 30 |
| 14 | 62 | 75 | 25 |
| 15 | 60 | 60 | 40 |
| 16 | 60 | 65 | 35 |
| 17 | 60 | 70 | 30 |
| 18 | 60 | 75 | 25 |
| 19 | 60 | 80 | 20 |

[1] Moles formaldehyde/100 moles cresols
[2] Approx. moles m-cresol/100 moles cresols
[3] Approx. moles p-cresol/100 moles cresols

EXAMPLE 20

A mixed aldehyde novolak resin was prepared in a manner similar to that of Example 1 using the following reagents in the following amounts:

m-cresol
p-cresol
trioxane
2-hydroxybenzaldehyde
p-toluene sulfonic acid catalyst $$\frac{\text{moles m-cresol}}{\text{total moles cresol}} = 0.55$$

$$\frac{\text{total moles aldehyde}}{\text{total moles cresol}} = 0.9$$

$$\frac{\text{moles 2-hydroxybenzaldehyde}}{\text{total moles aldehyde}} = 0.75$$

$$\frac{\text{moles catalyst}}{\text{total moles cresol}} = 0.01$$

EXAMPLE 21

A positive photoresist in accordance with the present invention was made by blending the following ingredients:

| Ingredient | Wt % | Wt % (solids basis) |
|---|---|---|
| High p-cresol novolak resin from Example 1 | 32.13 | 13.87 |
| Novolak resin made from phenolic component containing 65 wt % m-cresol and 35 wt % p-cresol | 18.40 | 7.36 |
| Photosensitizer | 5.30 | 5.30 |
| Alizarin Yellow A dye | 0.30 | 0.30 |
| EEP solvent | 43.53 | 74.02 |
| Striation control additive | 0.19 | 0.01 |
| | 100.00 | 100.86 |

The photosensitizer used was a mixture of the following compounds in the relative amounts indicated:

| | |
|---|---|
| 2,3,4-trihydroxybenzophenone-1,2-naphthoquinone-2-diazo-4-sulfonic acid monoester ("monoester") | 10.56% |
| 2,3,4-trihydroxybenzophenone-1,2-naphthoquinone-2-diazo-4-sulfonic acid diester ("diester") | 21.08% |
| 2,3,4-trihydroxybenzophenone-1,2-naphthoquinone- | 68.36% |

-continued

| 2-diazo-4-sulfonic acid triester ("triester") |
|---|

COMPARATIVE EXAMPLES A AND B

For comparative purposes two positive photoresists were formulated using the same ingredients as in Example 21, except that the photosensitizers employed were as follows:

| Comparative Resist A | | Comparative Resist B | |
|---|---|---|---|
| Monoester | 7.38 wt % | Monoester | 3.11 wt % |
| Diester | 13.33 wt % | Diester | 7.30 wt % |
| Triester | 79.29 wt % | Triester | 89.59 wt % |

EXAMPLE 22

This example illustrates the performance of the high p-cresol resin-containing positive photoresists of the present invention, Comparative Resists A and B and two commercially available positive resists.

Each, in turn, of the resist compositions indicated in Tables I and II below was spin coated on a track coater manufactured by Silicon Valley Group, California, onto thermally grown silicon/silicon dioxide coated wafers of 4 inch diameter and 5000 Angstrom oxide thickness. A uniform coating of 1.0 μm of resist film was obtained at spinning velocity of 3.500 revolutions per minute. The coated wafers were then soft baked either in an air circulating oven at 95° C. for 30 minutes or on a track with hot plate at 95° C. for 60 seconds. The resist film was then measured with a Nanospec AFT thickness measuring tool.

The coated wafers of Table I were exposed with a Cobilt CA800® fitted with a filter to provide actinic radiation of 365 nm wavelength. A Micromaske® mask with line and space widths of varying sizes, including some as small as 0.75 μm, was used to provide a selective exposure pattern. Exposure times were varied in order to determine the photospeed, i.e., the minimum amount of exposure energy (intensity × time) in millijoules/cm² which will solubilize the exposed areas of the resist so that the resist in the exposed areas will be completely removed/cleared during development.

The exposed resist-coated wafers produced as described above were placed in Teflon wafer boats and immersed for 60 seconds in a one-gallon Teflon container containing DYNATITH® NMD-3 developer, which is an aqueous alkaline tetramethylammonium hydroxide solution stabilized at about 19°±1° C. Upon removal from the developer, the wafers were rinsed in deionized water and dried by a burst of nitrogen gas or be placing them in a spin drier.

The developed wafers were then post-baked in an air circulating oven at about 150° C. for 30 minutes to increase the adhesion and chemical resistance of the undissolved portions of the coatings.

The coated wafers of Table II were exposed and developed in a similar manner using a Karl Suss MA 56 aligner which provided actinic radiation at 313 nm wavelength.

TABLE I

| Resist | Actinic Rad. Wavelength (nm) | Photo-speed (mj/cm²) | Unexposed film loss |
|---|---|---|---|
| Resist from Example 21 | 365 | 44 | 0.10 |
| Comparative Resist A | 365 | 96 | 1.30 |
| Comparative Resist B | 365 | 55 | 0.60 |
| DYNALITH® EPR-5000 resist[a] | 365 | 80 | 0 |
| AZ2400[b] | 365 | >100[c] | 0 |

[a]DYNALITH EPR-5000 photoresist, sold by the Dynachem Division of Morton Thiokol, Inc., uses a PAC based on 2,3,4-trihydroxybenzophenone esters of 1,2-naphtho-quinonediazide-5 sulfonic acid.
[b]AZ2400 positive photoresist sold by Shipley Co.
[c]Developed for 3 minutes

TABLE II

| Resist | Actinic Rad. Wavelenth (nm) | Photo-speed (mj/cm²) | Unexposed film loss |
|---|---|---|---|
| Resist from Example 21 | 313 | 60 | 0 |
| Comparative Resist A | 313 | 140 | 0 |
| Comparative Resist B | 313 | 180 | 0 |
| DYNALITH® EPR-5000 resist | 313 | 160 | 0 |
| AZ2400 | 313 | >240[d] | 0 |

[d]Three minute development

The above data clearly demonstrates the superior photospeed of the positive photoresists of the present invention.

EXAMPLE 23

This example illustrates the enhanced thermal performance of the positive photoresists of the present invention which contain mixed aldehyde novolak resins. A positive photoresist prepared by blending the following ingredients:

| Ingredient | Wt. in grams | Dry wt % |
|---|---|---|
| Mixed aldehyde novolak resin of Example 20 | 37.16 | 13.92 |
| Novolak resin made from phenolic component containing 70 wt % m-cresol and 30 wt % p-cresol | 18.19 | 7.76 |
| Photosensitizer from Example 21 | 5.39 | 5.39 |
| PMA solvent | 38.90 | 72.65 |
| Alizarin Yellow A dye | 0.27 | 0.27 |
| Striation control additive | 0.09 | 0.001 |
| | 100.00 | 99.99 |

The resulting resist had 27–34% solids and a viscosity of about 16–18 cps.

The resist was tested in a manner similar to that described in Example 22, except that an Ultratech Stepper and broad band light source were used. For comparison, the high p-cresol resin-containing photoresist of Example 21 was also tested, and the results are indicated below:

| | Developer | Photospeed (mj/cm²) | Post-bake Thermal Stability |
|---|---|---|---|
| Photoresist from Ex. 21 | EPD-85[a], 42 seconds spray at 19° C. | 130 | 130° C./30 min. |
| Photoresist from Ex. 23 | EPD-60[b] 22 seoonds | 120 | 180° C./30 min. |

| Developer | Photospeed (mj/cm²) | Post-bake Thermal Stability |
|---|---|---|
| spray at 19° C. | | |

<sup>a</sup>DYNALITH ®aqueous, alkaline developer (85% strength) sold by the Dynachem Division of Morton Thiokol, Inc.
<sup>b</sup>DYNALITH ®aqueous, alkaline developer (60% strength) sold by the Dynachem Division of Morton Thiokol, Inc.

These results indicate that the mixed aldehyde resin-containing resist compares favorably with the high p-cresol resin-containing resist, and, in fact, develops faster (in a weaker developer) and has greater post-bake thermal stability than the high p-cresol resin-containing photoresist.

We claim:

1. A method of forming a resist pattern on a substrate comprising:
   1. coating said substrate with a layer of a positive photoresist composition;
   2. exposing said layer patternwise to actinic radiation; and
   3. removing the exposed portion of said layer with an aqueous alkaline developer for the exposed resist composition to uncover the areas of the substrate beneath the exposed portions; said positive photoresist comprising, prior to exposure, an admixture of a 1,2-naphthoquinonediazide photosensitizer and a bindingly effective amount of a novolak resin wherein:
      A. said photosensitizer comprises an admixture of
         2,3,4-trihydroxybenzophenone-1,2-naphthoquinone-2-diazo-4-sulfonic acid triester;
         2,3,4-trihydroxybenzophenone-1,2-naphthoquinone-2-diazo-4-sulfonic acid diester, and
         2,3,4-trihydroxybenzophenone-1,2-naphthoquinone-2-diazo-4-sulfonic acid monoester in the following relative amounts:
         triester—about 50 wt % to about 75 wt %
         monoester and diester—balance, in a monester/diester weight ratio of about ½, said wt % being based on the total weight of the mono-, di-, and triester; and
      B. said novolak resin comprises a resin selected from the group consisting of:
         1. a resin prepared by condensing an aliphatic aldehyde, aromatic aldehyde or mixture thereof with a phenolic component comprising a mixture of p-cresol and m-cresol containing at least about 60 weight percent p-cresol, based on the total weight of p-cresol and m-cresol, and a sufficient amount of m-cresol to render said novolak resin soluble in a aqueous, alkaline solution, said phenolic component being essentially free of o-cresol; and
         2. a novolak resin which is the condensation product of (a) a mixture of m-cresol and p-cresol and (b) a mixture of formaldehyde or a formaldehyde precursor and a monohydroxy aromatic aldehyde selected from the group consisting of 2-hydroxybenzaldehyde, 3-hydroxybenzaldehyde and 4-hydroxybenzaldehyde.

2. The method of claim 1 wherein the positive photoresist further comprises a solvent, wherein said solvent is selected from the group consisting of (1) a mixture of ethyl Cellosolve acetate, butyl acetate, and xylene; (2) a mixture of propylene glycol monomethyl ether acetate, butyl acetate, and xylene; (3) ethyl-3-ethoxy propionate; (4) propylene glycol monomethyl ether acetate, butyl acetate, and ethyl-3-ethoxy propionate.

3. The method of claim 2 wherein the solvent is ethyl-3-ethoxy propionate.

4. The method of claim 1 wherein the novolak resin is resin B1.

5. The method of claim 4 wherein the mixture of p-cresol and m-cresol used to prepare novolak resin B1 has a p-cresol to m-cresol weight ratio of from about 60:40 to about 80:20.

6. The method of claim 1 wherein the novolak resin is resin B2.

7. The method of claim 1 wherein the positive photoresist comprises from about 2 parts by weight of novolak resin per part by weight of photosensitizer to about 6 parts by weight of novolak resin per part by weight of photosensitizer.

8. The method of claim 7 wherein the positive photoresist comprises about 4 parts by weight of novolak resin per part by weight of photosensitizer.

9. The method of claim 1 wherein the actinic radiation is produced by a laser.

10. A substrate coated with a thermally stable and highly resolved, exposed resist pattern, said resist pattern being formed from a positive photoresist composition which, prior to exposure to actinic radiation, comprises:
    A. a photosensitizer comprising an admixture of
       2,3,4-trihydroxybenzophenone-1,2-naphthoquinone-2-diazo-4-sulfonic acid triester;
       2,3,4-trihydroxybenzophenone-1,2-naphthoquinone-2-diazo-4-sulfonic acid diester, and
       2,3,4-trihydroxybenzophenone-1,2-naphthoquinone-2-diazo-4-sulfonic acid moester in the following relative amounts:
       triester—about 50 wt % to about 75 wt %
       moester and diester—balance, in a moester/diester weight ratio of about ½, said weight being based on the total weight of the mono-, di-, and triester; and
    B. a novolak resin comprising a resin selected from the group consisting of:
       1. a resin prepared by condensing an aliphatic aldehyde, aromatic aldehyde or mixture thereof with a phenolic component comprising a mixture of p-cresol and m-cresol containing at least about 60 weight percent p-cresol, based on the total weight of p-cresol and m-cresol, and a sufficient amount of m-cresol to render said novolak resin soluble in an aqueous, alkaline solution, said phenolic component being essentially free of o-cresol; and
       2. a novolak resin which is the condensation product of (a) a mixture of m-cresol and p-cresol and (b) a mixture of formaldehyde or a formaldehyde precursor and a monohydroxy aromatic aldehyde selected from the group consisting of 2-hydroxybenzaldehyde, 3-hydroxybenzaldehyde and 4-hydroxybenzaldehyde.

11. The substrate of claim 10 wherein the positive photoresist further comprises a solvent, wherein said solvent is selected from the group consisting of (1) a mixture of ethyl Cellosolve acetate, butyl acetate, and xylene; (2) a mixture of propylene glycol monomethyl ether acetate, butyl acetate, and xylene; (3) ethyl-3-ethoxy propionate; (4) propylene glycol monomethyl ether acetate; and (5) a mixture of propylene glycol monomethyl ether acetate, butyl acetate, and ethyl-3-ethoxy propionate.

12. The substrate of claim 11 wherein the solvent is ethyl-3-ethoxy propionate.

13. The substrate of claim 10 wherein the novolak resin is resin B1.

14. The substrate of claim 13 wherein the mixture of p-cresol and m-cresol used to prepare novolak resin B1 has a p-cresol and m-cresol weight ratio of from about 60:40 to about 80:20.

15. The substrate of claim 10 wherein the novolak resin is resin B2.

16. The method of claim 10 wherein the positive photoresist comprises from about 2 parts by weight of novolak resin per part by weight of photosensitizer to about 6 parts by weight of novolak resin per part by weight of photosensitizer.

17. The method of claim 16 wherein the positive photoresist comprises about 4 parts by weight of novolak resin per part by weight of photosensitizer.

* * * * *